United States Patent [19]

Ohno

[11] Patent Number: 4,924,121
[45] Date of Patent: May 8, 1990

[54] DIGITAL CLIPPING CIRCUIT WITH SOFT CLIP CHARACTERISTICS

[75] Inventor: Tatsuyuki Ohno, Fukaya, Japan
[73] Assignee: Kabushiki Kaisha Toshiba, Kawasaki, Japan
[21] Appl. No.: 329,207
[22] Filed: Mar. 27, 1989
[30] Foreign Application Priority Data Mar. 30, 1988 [JP] Japan .................................. 63-76903

[51] Int. Cl.$^5$ ............................................. H03K 5/08
[52] U.S. Cl. .................................. 307/542; 307/555;
307/264; 328/168
[58] Field of Search ............... 307/264, 362, 358, 540,
307/555, 542, 360; 358/327, 318, 315, 36;
360/39; 328/168, 169

[56] References Cited

U.S. PATENT DOCUMENTS

| 3,902,190 | 8/1975 | Donovan . | |
|---|---|---|---|
| 4,238,736 | 12/1980 | Slay | 307/555 |
| 4,326,223 | 4/1982 | Yamagiwa et al. . | |
| 4,382,198 | 5/1983 | Ishijima et al. | 307/360 |
| 4,570,193 | 2/1986 | Yamashita . | |
| 4,658,305 | 4/1987 | Tsushima . | |
| 4,717,848 | 1/1988 | Rabaey et al. | 307/355 |

Primary Examiner—John Zazworsky
Attorney, Agent, or Firm—Cushman, Darby & Cushman

[57] ABSTRACT

In a digital clipping circuit for clipping a digital input signal according to the present invention, a comparator compares the digital input signal with a reference signal, and outputs a first comparison signal when the level of the digital input signal is higher than that of the reference signal, and outputs a second comparison signal when the level of the digital input signal is lower than that of the reference signal. A selector selects the reference signal when the selector receives the first comparison signal, and selects the digital input signal when the selector receives the second comparison signal. A compensation signal generator receives the first comparison signal, and outputs a compensation signal for compensating the reference signal selected by the selector. A synthesizer synthesizes the reference signal selected by the selector, and the compensation signal output from the compensation signal generator, thereby to produce a compensated output signal.

15 Claims, 4 Drawing Sheets

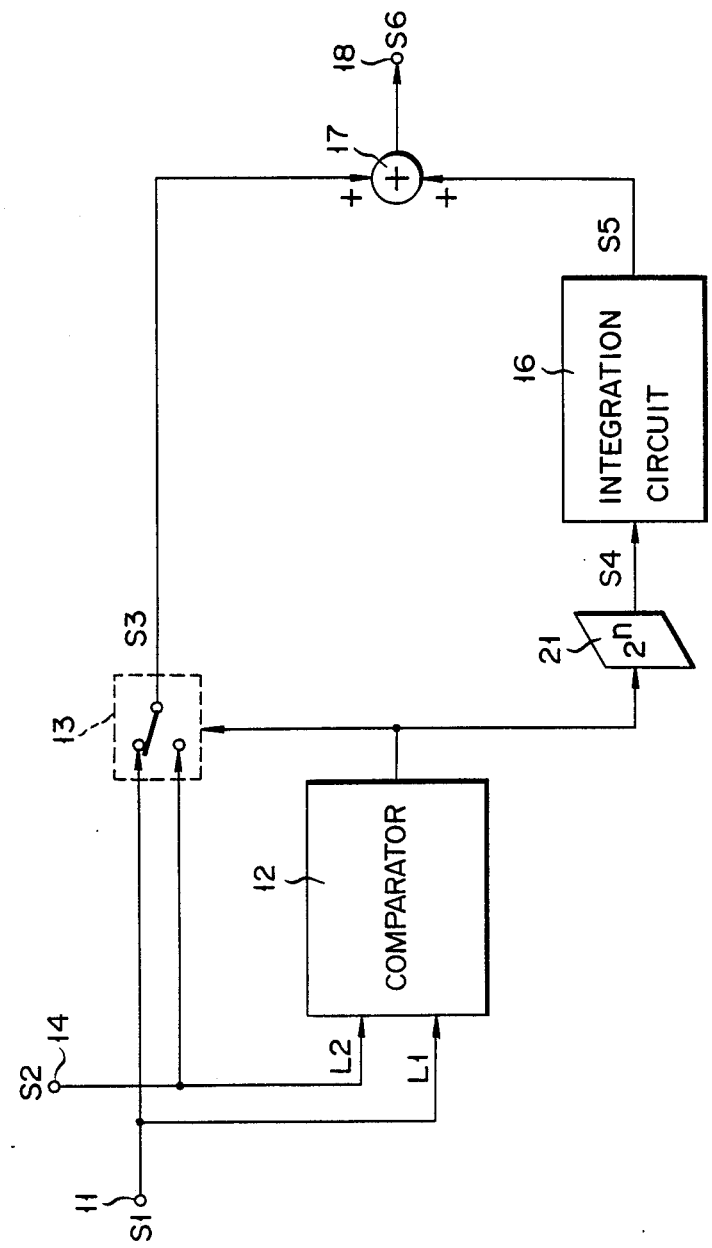
F I G. 2

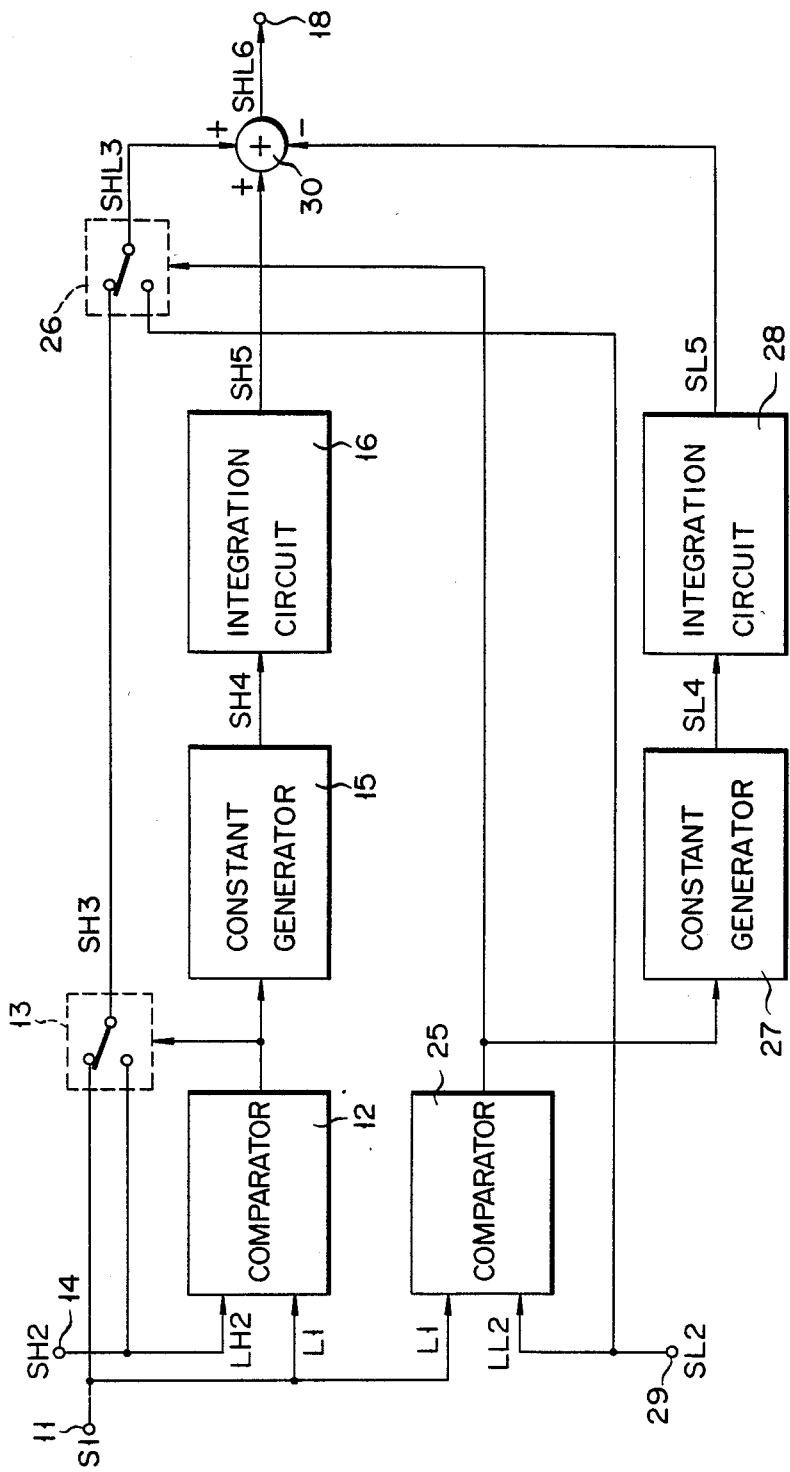
F I G. 4

DIGITAL CLIPPING CIRCUIT WITH SOFT CLIP CHARACTERISTICS

BACKGROUND OF THE INVENTION

1. Field of the Invention

The present invention relates to a digital clipping circuit, and, in particular, to a video signal clipping circuit used, for example, in a digital video tape recorder (hereinafter, referred to as "digital VTR").

2. Description of the Related Art

Recently, a digital recording system, which eliminates drawbacks of an analog recording system and achieves high image quality, has been employed in a conventional video tape recorder. A video tape recorder employing such a system is called a digital VTR. A signal processing circuit used in the digital VTR comprises a Y-C separation circuit for obtaining a luminance signal (Y signal) and a chrominance signal (C signal) from an NTSC signal, a pre-emphasis circuit for pre-emphasizing the luminance signal, and a digital clipping circuit for clipping a spike produced by the pre-emphasis at a predetermined level.

One example of a conventional digital clipping circuit comprises a comparator for comparing an input signal and a reference signal (clip level signal), and a switching circuit for selecting one of the input signal and the reference signal. When the level of the input signal is above the clip level, the input signal is clipped at the clip level and the clipped signal is output from the switching circuit. When the level of the input signal is equal to or lower than a clip level, the input signal is output from the switching circuit with no level changes. The clipped signal loses a soft-clip characteristic (or a rounded portion) and has a so-called hard-clip waveform. Thus, in the conventional digital clipping technique, the output signal is degraded.

There has been a great demand for a digital clipping circuit having a soft-clip characteristic, to prevent degradation of an output signal.

SUMMARY OF THE INVENTION

The object of the present invention is to provide a digital clipping circuit wherein degradation of an output signal can be minimized.

A digital clipping circuit for clipping a digital input signal, according to the present invention, comprises:

means for receiving a digital input signal;

comparing means for comparing the digital input signal with a reference signal, and outputting a first comparison signal when the level of the digital input signal is higher than that of the reference signal, and outputting a second comparison signal when the level of the digital input signal is lower than that of the reference signal;

selection means for selecting the reference signal when the selection means receives the first comparison signal from the comparing means, and for selecting the digital input signal when the selection means receives the second comparison signal;

compensation signal generating means for receiving the first comparison signal from the comparing means, and generating a compensation signal for compensating the reference signal selected by the selection means; and synthesizing means for synthesizing the reference signal selected by the selection means, and the compensation signal output from the compensation signal generating means, thereby to produce a compensated output signal.

BRIEF DESCRIPTION OF THE DRAWINGS

The foregoing aspects and other features of the invention will now be explained in the following description in connection with the accompanying drawings wherein:

FIG. 2 is a circuit diagram showing a second embodiment of the digital clipping circuit wherein a bit-shift circuit is applied to FIG. 1;

FIG. 4 is a circuit diagram showing a fourth embodiment of the digital clipping circuit according to the invention, which is constituted by combining the first embodiment of FIG. 1 and the third embodiment of FIG. 3.

DETAILED DESCRIPTION OF THE PREFERRED EMBODIMENTS

Figure 1:
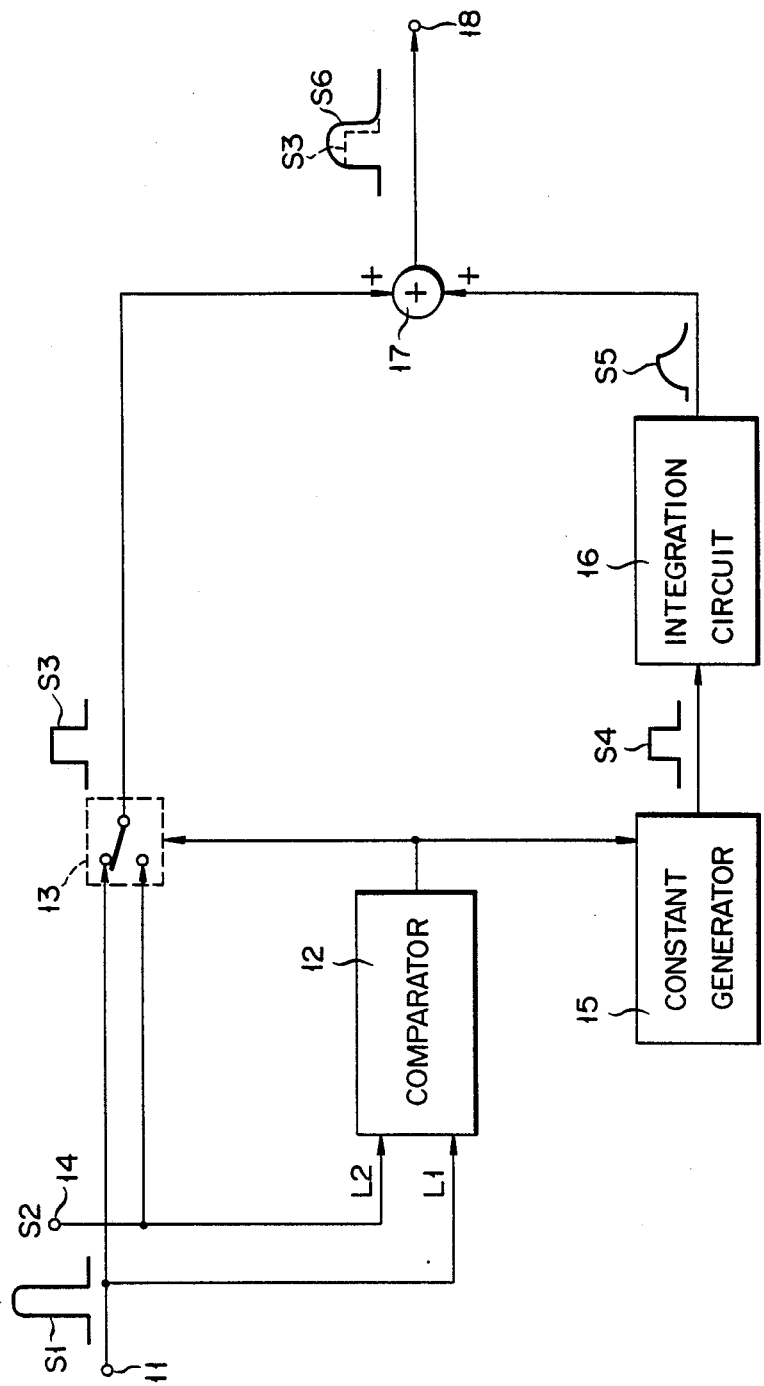
FIG. 1 is a circuit diagram showing a first embodiment of the digital clipping circuit according to the present invention.

FIG. 1 is a circuit diagram showing a first embodiment of the digital clipping circuit according to the present invention.

Input terminal 11 is connected to one input terminal of comparator 12 and to one of the fixed contacts of switch 13. Input terminal 14 is connected to the other input terminal of comparator 12 and to the other fixed contact of switch 13. An output terminal of comparator 12 is connected to switch 13 and to constant generator 15. A movable contact of switch 13 is connected to adder 17. Constant generator 15 is connected to integration circuit 16, and integration circuit 16 is connected to adder 17. Adder 17 is connected to output terminal 18.

The operation of the above-described circuit will now be explained. A digital signal is input to input terminal 11. Thus, the digital signal appears in each section of the circuit of FIG. 1. However, analog waveforms are shown in FIG. 1 for the sake of convenience.

Digital input signal S1 supplied to input terminal 11 is input to one input terminal of comparator 12 and to one fixed contact of switch 13. Reference signal S2 is supplied to input terminal 14. Reference signal S2 is input to the other input terminal of comparator 12 and to the other fixed contact of switch 13. The level of reference signal S2 is set to a clip level at which input signal S1 is clipped.

Comparator 12 compares levels L1 and L2 of signals S1 and S2, and outputs a comparison result (for example, when L1 is higher than L2, level "1" is output, and when L1 is equal to or lower than L2, level "0" is output). The comparison result is fed to switch 13 and constant generator 15. When switch 13 receives the comparison result of level "1" (i.e., input signal level L1 is higher than clip level L2), switch 13 selects reference signal S2. On the other hand, when switch 13 receives the comparison result of level "0" (i.e., input signal level L1 is equal to or lower than clip level L2), switch 13 selects input signal S1. In this manner, switch 13 outputs signal S3 which is obtained by hard-clipping input signal S1.

When the comparison result of level "1" (i.e., input signal level L1 is higher than clip level L2) is supplied from comparator 12 to constant generator 15, constant generator 15 outputs constant signal S4 representative of a predetermined constant. Constant signal S4 is supplied to integration circuit 16 and is integrated therein by a predetermined time constant. More specifically, integration circuit 16 receives constant signal S4 and produces integrated signal S5, the level of which gradually increases with a time constant and then gradually decreases.

Integrated signal S5 and the signal selected by switch 13 are added by adder 17. Then, adder 17 produces clipped output signal S6, the level of which gradually increases when input signal level L1 is higher than clip level L2, and gradually decreases when level L1 is equal to or lower than clip level L2. This clipped output signal is fed to output terminal 18.

As seen from the above, in the first embodiment of the invention, the input signal is hard-clipped by a hard-clip circuit comprising comparator 12 and switching circuit 13, and the hard-clipped signal is added to the integrated output signal, thereby to obtain a soft-clipped signal.

Since the waveform of hard-clipped signal S3 is changed to a gradually varying waveform according to the integrated output, clipped output signal S6 having a desired soft clip characteristic can be obtained.

FIG. 2 is a circuit diagram showing a second embodiment of the invention.

In the second embodiment, the comparison result of comparator 12 is bit-shifted by bit-shift circuit 21 to generate constant signal S4. With this structure, a clipped signal having a soft-clip characteristic can also be obtained. In FIG. 2, the elements which have already appeared in FIG. 1 are indicated by the same reference numerals.

Figure 3:
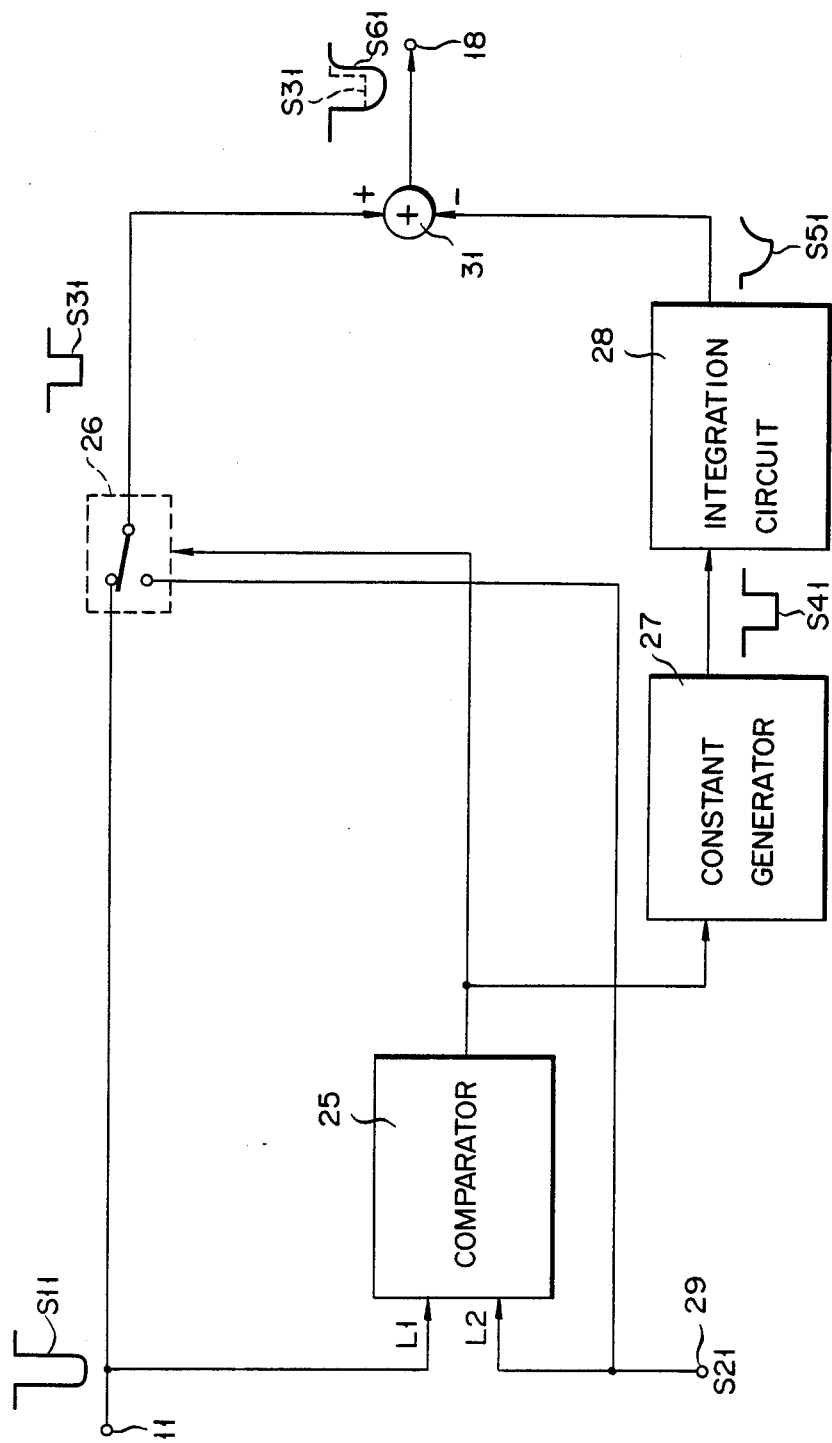
FIG. 3 is a circuit diagram showing a third embodiment of the digital clipping circuit according to the invention.

The above description has been directed to the case where an upper portion of an input signal is clipped, as shown in FIG. 1. However, when input signal S11 and reference signal S21, which have opposite polarities, are input to comparator 25, it is possible to soft-clip a lower portion of the input signal by employing a circuit structure as shown in FIG. 3. When the lower portion of the input signal is equal to or lower than a clip level, integrated signal S51 from integration circuit 28 is subtracted from hard-clipped signal S31 to obtain output signal S61. By combining this embodiment with the first embodiment, a circuit wherein an upper portion and a lower portion of an input signal are simultaneously clipped can be realized.

FIG. 4 shows a circuit constituted by combining a clipping circuit for clipping an upper portion of an input signal (hereinafter, called "upper clip circuit") and a clipping circuit for clipping a lower portion of the input signal ("lower clip circuit"). In FIG. 4, signals relating to the clipping of the upper portion of the input signal, and the levels of these signals, are indicated by symbol "H", which is used in combination with the reference numerals used in FIG. 1. Signals relating to the clipping of the lower portion of the input signal, and the levels of these signals, are indicated by symbol "L". Also, signals relating to the clipping of the upper and lower portions of the input signal are indicated by symbol "HL".

In FIG. 4, an upper clip circuit is constituted by comparator 12, switch 13, constant generator 15, and integration circuit 16. On the other hand, an lower clip circuit is constituted by another comparator 25, switch 26, constant generator 27, and integration circuit 28. Reference signal SL2 supplied to input terminal 29 has a reference level for the lower clipping. Switch 26 used for the lower clipping is connected at the rear stage of switch 13, so as to hard-clip the lower portion of upper-clip signal SH3. By this structure, switch 26 outputs signal SH3 which is obtained by hard-clipping the upper and lower portions of the input signal. Adder 30 adds hard-clipped signal SHL3 and integrated output signal SH5 from integration circuit 16, and subtracts integrated output signal SL5 from the sum of signals SHL3 and SH5. Thus, adder 30 outputs clipped signal SHL6 in which the upper and lower portions of the input signal are soft-clipped.

As described above, the present invention can provide a digital clip circuit wherein an input signal can be soft-clipped and the signal degradation inherent in a conventional digital clipping technique can be overcome.

The present invention is not limited to the above four embodiments, and various modifications and changes may be made to the invention.

What is claimed is:

1. A digital clipping circuit for clipping a digital input signal, comprising:
   means for receiving a digital input signal;
   comparing means for comparing the digital input signal received by said receiving means with a reference signal, and outputting a first comparison signal when the level of the digital input signal is higher than that of the reference signal, and outputting a second comparison signal when the level of the digital input signal is lower than that of the reference signal;
   selection means for selecting the reference signal when said selection means receives the first comparison signal from said comparing means, and for selecting the digital input signal when said selection means receives the second comparison signal therefrom;
   compensation signal generating means for receiving the first comparison signal from the comparing means, and generating a compensation signal for compensating the reference signal selected by said selection means; and
   synthesizing means for synthesizing the reference signal selected by said selection means, and the compensation signal output from said compensation signal generating means, thereby to produce a compensated output signal.

2. The circuit according to claim 1, wherein said compensation signal generating means comprises an integration circuit for receiving said first comparison signal and producing a corresponding integrated signal.

3. The circuit according to claim 1, wherein said compensation signal generating means comprises a constant generating circuit for receiving the first comparison signal and generating a signal representative of a predetermined constant, and an integration circuit for receiving the signal representative of the predetermined constant generated from said constant generating circuit and producing a corresponding integrated signal.

4. The circuit according to claim 3, wherein said constant generating circuit includes a bit-shift circuit.

5. The circuit according to claim 1, wherein said selection means includes a switch.

6. The circuit according to claim 1, wherein said synthesizing means includes an adding circuit.

7. The circuit according to claim 1, wherein said synthesizing means includes a subtracting circuit.

8. A digital clipping circuit for clipping a digital input signal, comprising:

means for receiving a digital input signal;

first comparing means for comparing the digital input signal received by said receiving means with a first reference signal, and outputting a first comparison signal when the level of the digital input signal is higher than that of the first reference signal, and outputting a second comparison signal when the level of the digital input signal is lower than that of the first reference signal;

first selection means for selecting the first reference signal when said selection means receives the first comparison signal from said first comparing means, and for selecting the digital input signal when said selection means receives the second comparison signal therefrom;

first compensation signal generating means for receiving the first comparison signal from said first comparing means, and generating a first compensation signal for compensating the first reference signal selected by said first selection means;

second comparing means for comparing said digital input signal received by said receiving means with a second reference signal, and outputting a third comparison signal when the level of the digital input signal is higher than that of the second reference signal, and outputting a fourth comparison signal when the level of the digital input signal is lower than that of the second reference signal;

second selection means for selecting the second reference signal when said selection means receives the third comparison signal from said second comparing means, and for selecting the digital input signal when said selection means receives the fourth comparison signal therefrom;

second compensation signal generating means for receiving the third comparison signal from the second comparing means, and generating a second compensation signal for compensating the second reference signal selected by said second selection means; and synthesizing means for synthesizing the first reference signal selected by said first selection means, the second reference signal selected by said second selection means, and the first and second compensation signals generated from said first and second compensation signal generating means, thereby to produce a compensated output signal.

9. The circuit according to claim 8, wherein said first compensation signal generating means comprises a first integration circuit for receiving the first comparison signal and outputting a corresponding integrated signal.

10. The circuit according to claim 8, wherein said first compensation signal generating means comprises a first constant generating circuit for receiving the first comparison signal and outputting a signal representative of a predetermined constant, and a first integration circuit for receiving the signal representative of the predetermined constant generated from said first constant generating circuit and outputting a corresponding integrated signal.

11. The circuit according to claim 10, wherein said first constant generating circuit includes a bit-shift circuit.

12. The circuit according to claim 8, wherein said second compensation signal generating means comprises a second integration circuit for receiving the third comparison signal and outputting a corresponding integrated signal.

13. The circuit according to claim 8, wherein said second compensation signal generating means comprises a second constant generating circuit for receiving the third comparison signal and outputting a signal representative of a predetermined constant, and a second integration circuit for receiving the signal representative of the predetermined constant generated from said second constant generating circuit and outputting a corresponding integrated signal.

14. The circuit according to claim 13, wherein said second constant generating circuit includes a bit-shift circuit.

15. The circuit according to claim 8, wherein each of said first and second selection means includes a switch.

* * * * *